(12) United States Patent
Yokoyama

(10) Patent No.: US 6,698,941 B2
(45) Date of Patent: Mar. 2, 2004

(54) MODE LOCKING SEMICONDUCTOR LASER SYSTEM INCLUDING EXTERNAL CAVITY

(75) Inventor: Hiroyuki Yokoyama, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/994,853

(22) Filed: Nov. 28, 2001

(65) Prior Publication Data

US 2002/0064353 A1 May 30, 2002

(30) Foreign Application Priority Data

Nov. 28, 2000 (JP) .......................................... 2000-361859

(51) Int. Cl.[7] ................................................ G02B 6/36
(52) U.S. Cl. .............................. 385/92; 385/88; 385/91; 385/93; 372/6; 372/18; 372/94
(58) Field of Search ......................... 385/88–94; 372/6, 372/18, 94

(56) References Cited

U.S. PATENT DOCUMENTS

| | | | |
|---|---|---|---|
| 4,677,630 A | * | 6/1987 | Fujita et al. ................... 372/32 |
| 5,008,887 A | * | 4/1991 | Kafka et al. ..................... 372/6 |
| 5,414,725 A | * | 5/1995 | Fermann et al. ............... 372/18 |
| 5,485,481 A | * | 1/1996 | Ventrudo et al. ............... 372/6 |
| 5,646,774 A | * | 7/1997 | Takara et al. ................ 359/340 |
| 5,717,804 A | * | 2/1998 | Pan et al. ...................... 385/94 |
| 5,802,084 A | * | 9/1998 | Bowers et al. ................. 372/18 |
| 5,812,716 A | * | 9/1998 | Ohishi .......................... 385/92 |
| 6,192,058 B1 | * | 2/2001 | Abeles .......................... 372/6 |
| 6,375,364 B1 | * | 4/2002 | Wu ............................... 385/88 |
| 6,418,251 B1 | * | 7/2002 | Boscha ......................... 385/31 |

\* cited by examiner

Primary Examiner—Phan T. H. Palmer
Assistant Examiner—Jennifer Doan
(74) Attorney, Agent, or Firm—Young & Thompson

(57) ABSTRACT

An optical system includes a cavity having a semiconductor light-emitting device, and an optical fiber having a first terminal optically coupled to the semiconductor light-emitting device, the cavity having a cavity length defined between a first facet of the semiconductor light-emitting device and second terminal of the optical fiber, wherein a length of the optical fiber is such that a mode-locking oscillation frequency is not more than 1 GHz.

12 Claims, 12 Drawing Sheets

MODE LOCKING SEMICONDUCTOR LASER SYSTEM INCLUDING EXTERNAL CAVITY

BACKGROUND OF THE INVENTION

1. Field of the Invention

The present invention relates to a mode locking semiconductor laser system with an external cavity, and more particularly to a mode locking semiconductor laser system with an external cavity for emitting an ultra-short optical pulse for optical measurement techniques such as an (optical signal waveform measurement at an ultra high speed.

2. Description of the Related Art

Since the recent progress for optical technology enables the emission of the ultra-short optical pulse in femtosecond order, instead of making electrical measurements with such equipment as sampling oscilloscopes, it has been attempted that the ultra-short optical pulse be used as a sampling gate pulse for measuring an ultra high speed phenomenon.

The ultra-short optical pulse is used as the sampling gate pulse for measuring optical sampling waveforms, for example, an optical measurement for eye patterns of the optical waveform. For measuring individual sampling values, it is necessary that respective cross-correlation signal optical pulses are photoelectrically converted without any interference with any adjacent pulse. For this purpose, it is further necessary that a cyclic frequency of the cross-correlation signal optical pulse or a cyclic frequency of the sampling optical pulse is set under a frequency band of an optical receiving system. For this reason, differently from optical communication, a string of optical pulses with a low cyclic frequency of not more than 1GHz is needed.

For improvement in resolving power, the ultra-short optical pulse of a few picoseconds to a few femtoseconds is desirable. The mode locking semiconductor laser utilizing the external cavity is usable for emitting strings of the ultra-short optical pulses of the low cyclic frequency.

FIG. 1 is a schematic view of a conventional mode locking semiconductor laser system with the external cavity. The mode locking semiconductor laser system includes a semiconductor laser device 1 which includes a gain region 1a and a saturable absorbing region 1b with a saturable absorbing region facet 11b. The mode locking semiconductor laser system further includes a terminal reflective mirror 8 which forms an external cavity in cooperation with the saturable absorbing region facet 11b. Namely, the external cavity is defined between the terminal reflective mirror 8 and the saturable absorbing region facet 11b.

The mode locking semiconductor laser system further includes a first collimator lens 2a, a wavelength splitter 3, and an intermediate reflective mirror 7 which are aligned on an optical axis between the semiconductor laser device 1 and the reflective mirror 8. The first collimator lens 2a is disposed between the semiconductor laser device 1 and the wavelength splitter 3. The wavelength splitter 3 is disposed between the first collimator lens 2a and the intermediate reflective mirror 7. The intermediate reflective mirror 7 is provided at an intermediate point on the optical axis between the wavelength splitter 3 and the terminal reflective mirror 8.

The mode locking semiconductor laser system further includes a second collimator lens 2b for allowing an optical output emitted from the saturable absorbing region facet 11b to be transmitted through the second collimator lens 2b. A wavelength of the laser beam emitted from the saturable absorbing region facet 11b depends on an angle of the wavelength splitter 3 with reference to the optical axis of the external cavity.

The intermediate reflective mirror 7 allows the size down of the mode locking semiconductor laser system, but would be an optical element for the mode locking semiconductor laser system. A cavity length is defined between the saturable absorbing region facet 11b and the reflective mirror 8. The intermediate reflective mirror 7 is movable in a direction labeled with an arrow mark "A" which is parallel to the optical axis. The movement or displacement of the intermediate reflective mirror 7 varies the cavity length. Variation of the cavity length varies the cyclic frequency or the cycle of reciprocal of the optical pulse in the cavity.

For optical measurement, it is important that the oscillation frequency, the cyclic frequency, the polarization state, and the optical output intensity are highly stable. For example, in order for detecting a variation of a plane of a polarized wave in accordance with a driving voltage for driving a circuit to be measured, the plane of the polarized wave is kept constant for a highly accurate measurement. For time sequential sampling, sampling pulses with a stable cyclic frequency are needed. For example, in case of a cyclic frequency of 1 GHz with a fluctuation of not more than several tens Hz order, a high stability of the frequency in the order of 1E-7 to 1E-8 order is necessary. It is further necessary that the cyclic frequency of the sampling pulses follows to the fluctuation of the cyclic frequency of the measured light or the measured signal.

The conventional mode locking semiconductor laser system of FIG. 1 allows that the mode locking frequency varies beyond an acceptable range from a target frequency due to a cavity length variation caused by a temperature variation.

The mode locking semiconductor device having a cyclic frequency (mode locking oscillation frequency) of not more than 1 GHz needs the external cavity with a cavity length of ten centimeters to several tens of centimeters. The mode locking semiconductor laser system of FIG. 1 utilizes a free space for the optical path, for which reason the cavity length is long. If the cyclic frequency is 1 GHz, the cavity length is 15 centimeters. If the cyclic frequency is 250 MHz, the cavity length is 60 centimeters. It is difficult that the long optical path is accommodated within a narrow space. It is difficult to reduce the size of the mode locking semiconductor laser system. The large size mode locking semiconductor laser system is disadvantageous in that a slight vibration or a slight strain may cause a relatively large displacement of parts and the mode locking semiconductor laser system is likely to receive influences of the temperature variation and the mechanical vibration. The large size mode locking semiconductor laser system is likely to allow that the oscillation frequency, the cyclic frequency, the polarization state and the optical output intensity vary beyond respective acceptable ranges. It is difficult to obtain a desirable long time and highly stable operation.

In addition to the long cavity length, the intermediate reflective mirror 7 makes it difficult and inconvenient to adjust the optical axis of the cavity. If the mode locking semiconductor laser with the external cavity is incorporated into a measuring system, then the measuring system has a large size.

In the above circumstances, the development of a novel mode locking semiconductor laser system including a semiconductor laser device and an external cavity free from the above problems is desirable.

SUMMARY OF THE INVENTION

Accordingly, it is an object of the present invention to provide a novel mode locking semiconductor laser system including a semiconductor laser device and an external cavity free from the above problems.

It is a further object of the present invention to provide a novel mode locking semiconductor laser system including a semiconductor laser device and an external cavity, wherein the mode locking semiconductor laser system has a reduced size.

It is a still further object of the present invention to provide a novel mode locking semiconductor laser system including a semiconductor laser device and an external cavity, wherein the mode locking semiconductor laser system is superior in stability for a long time in oscillation frequency, cyclic frequency and polarized wave plane against temperature variation and mechanical vibration.

It is yet a further object of the present invention to provide a novel mode locking semiconductor laser system including a semiconductor laser device and an external cavity, wherein the mode locking semiconductor laser system is variable in oscillation frequency and cyclic frequency.

The present invention provides an optical system including a cavity which comprises a semiconductor light-emitting device, and an optical fiber having a first terminal optically coupled to the semiconductor light-emitting device, the cavity having a cavity length defined between a first facet of the semiconductor light-emitting device and a second terminal of the optical fiber, wherein a length of the optical fiber is such that a mode-locking oscillation frequency is not more than 1 GHz.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DETAILED DESCRIPTION OF THE PREFERRED EMBODIMENTS

A first aspect of the present invention is an optical system including a cavity which comprises a semiconductor light-emitting device, and an optical fiber having a first terminal optically coupled to the semiconductor light-emitting device, the cavity having a cavity length defined between a first facet of the semiconductor light-emitting device and a second terminal of the optical fiber, wherein a length of the optical fiber is such that a mode-locking oscillation frequency is not more than 1 GHz.

It is preferable that the optical system comprises a single module, provided that the semiconductor light-emitting device and the optical fiber are accommodated in a single case having a size smaller than the length of the optical fiber. The single case further may preferably accommodate a temperature controller for controlling a temperature in the single case.

It is also preferable that the optical system comprises separate first and second modules which are connectable to each other through at least one connector, provided that the semiconductor light-emitting device is accommodated in the first case and the optical fiber is accommodated in the second case having a size smaller than the length of the optical fiber. Each of the first and second cases further may preferably accommodate a temperature controller for controlling a temperature in each of the first and second cases.

A second aspect of the present invention is an optical system including a ring-cavity which comprises a semiconductor light-emitting device, and a looped optical fiber having first and second terminals optically coupled to the semiconductor light-omitting device, the ring-cavity having a cavity length defined by a length of the looped optical fiber and an optical path length between the first and second terminals, wherein a length of the looped optical fiber is such that a mode-locking oscillation frequency is not more than 1 GHz.

It is preferable that the optical system comprises a single module, provided that the semiconductor light-emitting device and the optical fiber are accommodated in a single case having a size smaller than the length of the looped optical fiber. The single case further may preferably accommodate a temperature controller for controlling a temperature in the single case.

It is preferable that the optical system comprises separate first and second modules which are connectable to each other through at least one connector, provided that the semiconductor light-emitting device is accommodated in the first case and the looped optical fiber is accommodated in the second case having a size smaller than the length of the looped optical fiber. Each of the first and second cases may preferably accommodate a temperature controller for controlling a temperature in each of the first and second cases.

First Embodiment

Figure 1:
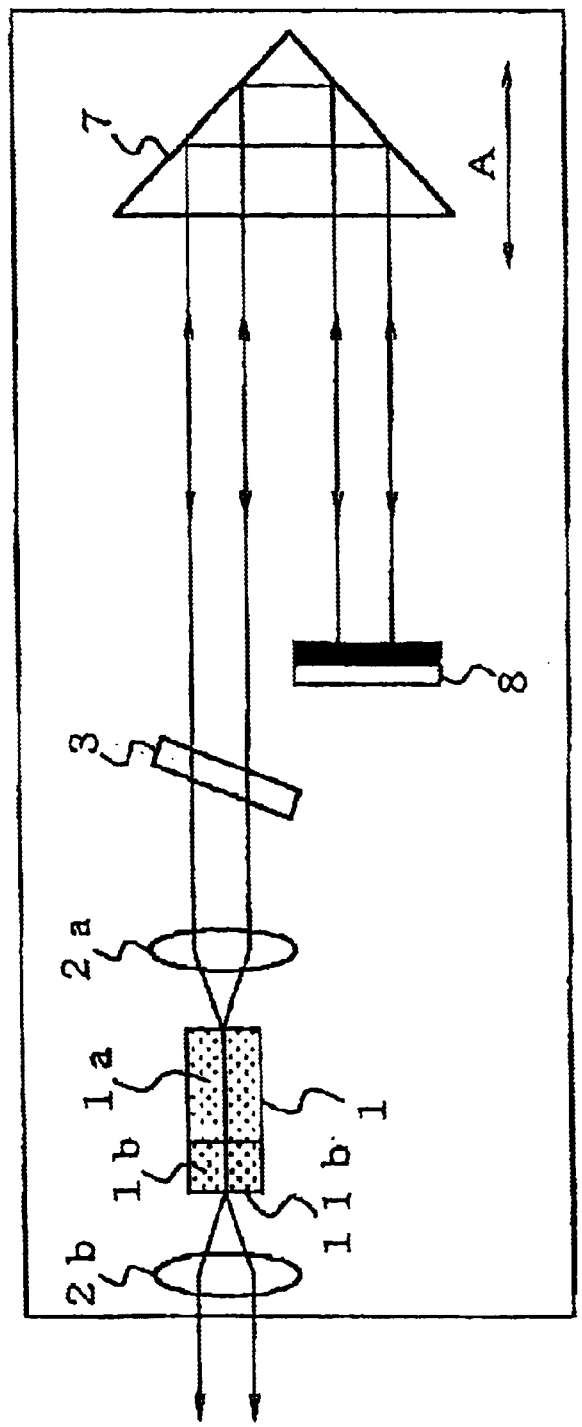
FIG. 1 is a schematic view of a conventional mode locking semiconductor laser system including the mode locking semiconductor laser and the external cavity.
Figure 2:
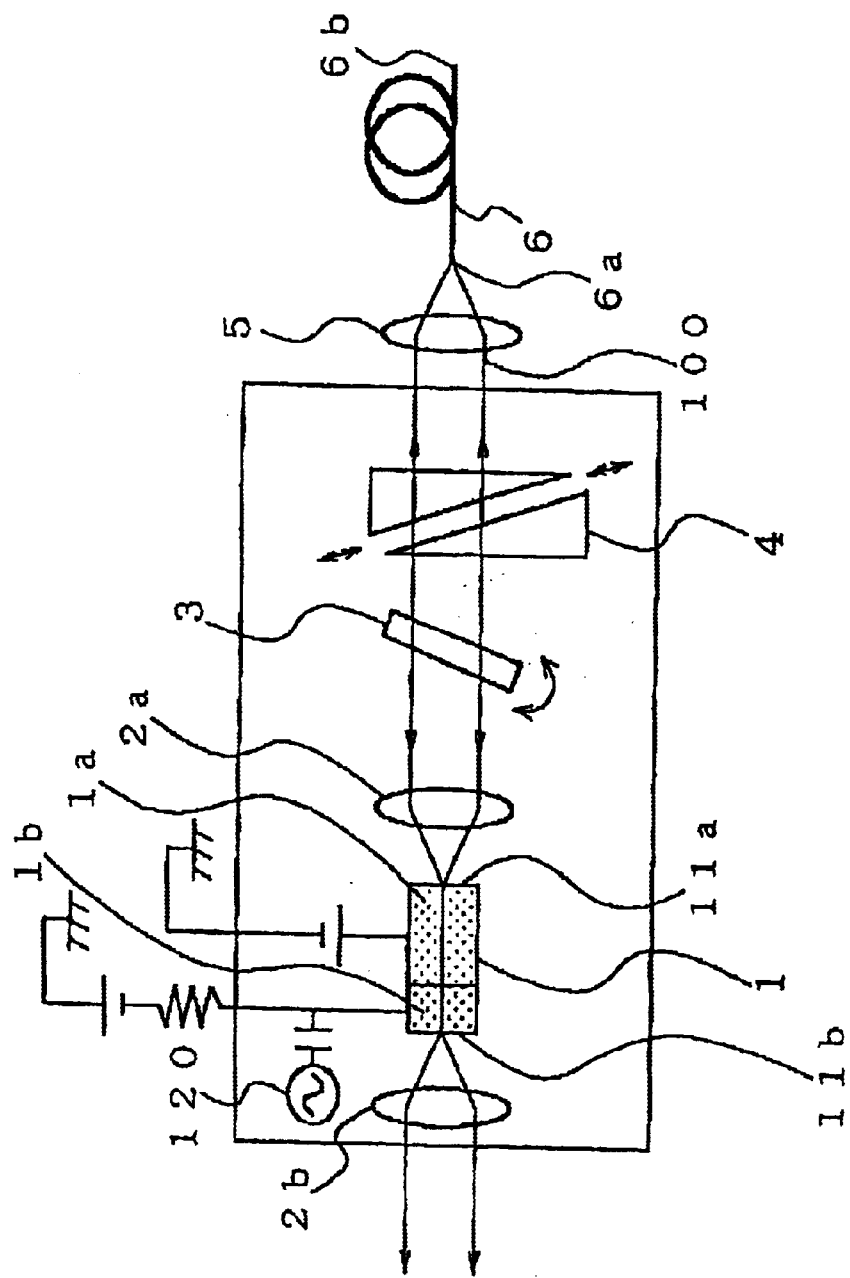
FIG. 2 is a schematic view of a first novel mode locking semiconductor laser system including a mode locking semiconductor laser and an external cavity in a first embodiment in accordance with the present invention.

A first embodiment according to the present invention will be described in detail with reference to the drawings. FIG. 2 is a schematic view of a first novel mode locking semiconductor laser system including a mode locking semiconductor laser and an external cavity in a first embodiment in accordance with the present invention. The mode locking semiconductor laser system includes a semiconductor laser device 1 which includes a gain region 1a with a non-reflective facet 11a and a saturable absorbing region 1b with a highly reflective facet 11b. The mode locking semiconductor laser system further includes a first collimator lens 2a, a wavelength splitter 3, and an optical path length adjuster 4 which are aligned on an optical axis. The first collimator lens 2a is disposed between the semiconductor laser device 1 and the wavelength splitter 3. The wavelength splitter 3 is disposed between the first collimator lens 2a and the optical path length adjuster 4.

The mode locking semiconductor laser system further includes a condenser lens 5 and a polarization-preserving optical fiber 6 with a non-reflective terminal 6a and a highly reflective terminal 6b. The condenser lens 5 is disposed between the optical path length adjuster 4 and the non-reflective terminal 6a of the polarization-preserving optical fiber 6. The polarization-preserving optical fiber 6 is optically coupled to the semiconductor laser device 1 through the first collimator lens 2a, the wavelength splitter 3, the optical path length adjuster 4 and the condenser lens 5. A cavity is defined between the highly reflective facet 11b of the semiconductor laser device 1 and the highly reflective terminal 6b of the polarization-preserving optical fiber 6.

The mode locking semiconductor laser system further includes a second collimator lens 2b for allowing an optical output emitted from the highly reflective facet 11b to be transmitted through the second collimator lens 2b. A current injection is made into the gain region 1a of the semiconductor laser device 1 for light emission and light amplification. A high frequency voltage is applied at a mode locking frequency to the saturable absorption region 1b of the semiconductor laser device 1 by a high frequency power supply 120.

The current injection into the gain region 1a and high frequency voltage application at the mode locking frequency to the saturable absorption region 1b cause a laser emission. An emitted laser beam 100 is reflected by the highly reflective facet 11b of the semiconductor laser device 1 and by the highly reflective terminal 6b of the polarization-preserving optical fiber 6. Namely, the emitted laser beam 100 is cyclically reciprocated between the highly reflective facet 11b of the semiconductor laser device 1 and by the highly reflective terminal 6b of the polarization-preserving optical fiber 6 at a time period T, wherein $T=2L/c$, where L is the cavity length in vacuum length conversion and c is the velocity of light. The cyclic reciprocation of the emitted laser beam 100 amplifies the intensity of the laser beam 100. A laser oscillation is caused at a cyclic frequency (mode locking frequency) f ($f=c/2L$) which synchronizes with the time period T. The laser beam 100 is emitted from the highly reflective facet 11b of the semiconductor laser device 1 through the second condenser lens 2b.

There is no particular limitation to the structure of the semiconductor laser device 1. In this embodiment, the semiconductor laser device 1 includes the gain region 1a receiving the current injection for emission and amplification of light, and the saturable absorption region 1b which decreases the light absorption upon increase of the light intensity. The gain region 1a has an active layer. The saturable absorption region 1b has a saturable absorption layer. The active layer and the saturable absorption layer may optionally comprise an InGaAs/InGaAsP multiple quantum well structure with a band gap wavelength of 1.55 micrometers. The active layer and the saturable absorption layer may alternatively comprise a bulk structure. The active layer and the saturable absorption layer may be provided on a stripe-shaped region in plan view. Current block layers are further provided on both sides of the stripe-shaped region on which the active layer and the saturable absorption layer are provided, so that the active layer and the saturable absorption layer may be buried.

The non-reflective facet 11a and the highly reflective facet 11b are coated with dielectric multilayer structures, (or example, $TiO_2/SiO_2$ multilayer structure or $Si/SiO_2$ multilayer structures. The non-reflective facet 11a has a low reflectivity "R2", whilst the highly reflective facet 11b has a high reflectivity "R1". R2 may be about 0.8. R1 may be about 1E-4 or lower. The gain region 1a and the saturable absorption region 1b are applied with powers independently from each other. For example, the gain region 1a is applied with DC-current. The saturable absorption region 1b is applied with a back-bias voltage and a high frequency signal at a mode-locking frequency. It may, however, be possible as a modification that no power is supplied to the saturable absorption region 1b, whilst the gain region 1a is injected with a current modulated with the mode-locking frequency. It may also be possible as another modification that the semiconductor laser device 1 comprises only the gain region 1a with no saturable absorption region, wherein a high frequency signal is superimposed with the injection current into the gain region 1a.

An optical pulse is incident into the saturable absorption region 1b, wherein the optical pulse includes a first half portion and a second half portion which is higher in light intensity than the first half portion. The saturable absorption region 1b is capable of absorbing the first half portion, but is saturated with the second half portion, whereby the second half portion of the optical pulse may pass through the saturable absorption region 1b without absorption. The optical pulse having passed through the saturable absorption region 1b has a sharpness or an abruptness with a narrow pulse width.

The saturable absorption region 1b exhibits a self-absorption modulation effect which causes a phase synchronization between laser oscillation longitudinal modes. The high frequency signal is supplied to the saturable absorption region 1b, so that the generation timing of the mode-locking optical pulses is synchronized with the supplied high frequency signal.

The wavelength splitter 3 may, for example, comprise a Fabry-Ferot etalon (hereinafter refereed to as etalon). The etalon may comprise a plane-parallel plate having opposite reflective planes coated with high reflective coats. The plane-parallel plate may, for example, comprise a quartz plate or a glass plate. The high reflective coats may, for example, comprise a dielectric multilayer structure or a metal layer. The opposite reflective planes are parallel to each other. The light transmittivity has the maximum at a wavelength distance which is defined by both respective reflectivities of the opposite reflective planes and an effective distance on the optical axis between the opposite reflective planes. The etalon is aligned so that the opposite reflective planes are adjusted in tilting angle to the optical axis for adjusting the effective distance, thereby adjusting the wavelength at which the transmittivity takes a maximum value. The adjustment of the tilting angle of the etalon to the optical axis makes it possible to adjust the wavelength of the laser beam.

Alternatively, the wavelength splitter 3 may also comprise another etalon which comprises a piezoelectric transducer sandwiched by two plane-mirrors, wherein the piezoelectric transducer is applied with a voltage. The adjustment of the applied voltage level to the piezoelectric transducer may adjust an optically effective distance between the two plane-mirrors for adjusting the wavelength at which the transmittivity takes a maximum value.

Further, alternatively, the wavelength splitter 3 may also comprise another etalon which comprises a liquid crystal sandwiched by two plane-mirrors, wherein the piezoelectric transducer is applied with a voltage. The adjustment of the applied voltage level to the liquid crystal may adjust an optically effective distance between the two plane-mirrors for adjusting the wavelength at which the transmittivity takes a maximum value.

The optical path length adjuster 4 is provided for compensating an error of the length of the polarization-preserving optical fiber 6. The length of the cavity is defined between the highly reflective facet 11b of the semiconductor laser device 1 and the highly reflective terminal 6b of the polarization-preserving optical fiber 6. Namely, the optical path length adjuster 4 may compensate the length of the cavity.

Figure 3:
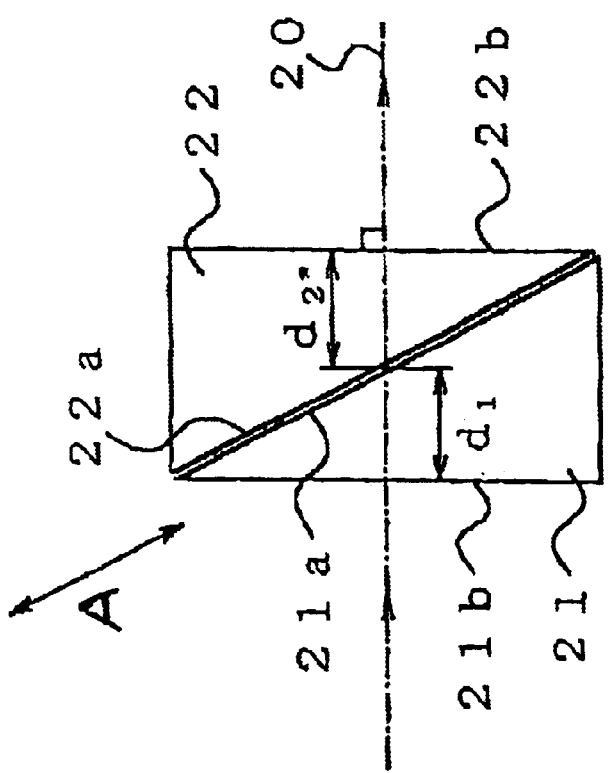
FIG. 3 is a schematic view of one example of the optical path length adjuster.

FIG. 3 is a schematic view of one example of the optical path length adjuster. The optical path length adjuster 4 may, for example, comprise paired wedge-prisms 21 and 22 which may, for example, comprise transparent materials such as quartz or glass. The two wedge-prisms 21 and 22 have the same refractive indexes and the same vertical angle. The paired wedge-prisms 21 and 22 are combined so that inclined planes 21a and 22a of the paired wedge-prisms 21 and 22 face to each other with or without contact with each other, and that vertical planes 21b and 22b are vertical to an optical axis 20. The paired wedge-prisms 21 and 22 are relatively movable or slidable in a direction marked with an arrow mark "A" which is parallel to the inclined planes 21a and 22a. The relative movement of the two wedge-prisms 21, and 22 varies respective optically effective distances d1 and d2 of the paired wedge-prisms 21 and 22 on the optical axis with keeping the vertical planes 21b and 22b to be vertical to an optical axis 20. The variation of the optically effective distances d1 and d2 of the paired wedge-prisms 21 and 22 on the optical axis varies an effective optical path length, for which reason the optical path length adjuster 4 may compensate the error of the optical path length of the cavity. Namely, the optical path length adjuster 4 may compensate the error of the length of the polarization-preserving optical fiber 6.

Figure 4:
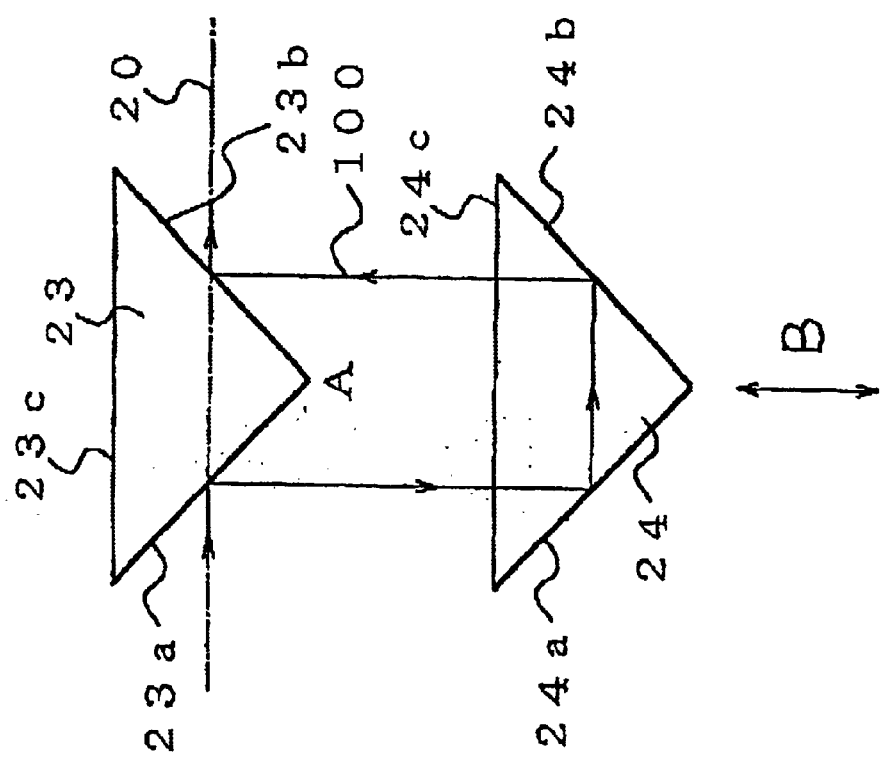
FIG. 4 is a schematic view of another example of the optical path length adjuster.

FIG. 4 is a schematic view of another example of the optical path length adjuster. The optical path length adjuster 4 may, alternatively, comprise a pair of right-angled isosceles triangle prisms 23 and 24 which may, for example, comprise transparent materials such as quartz or glass. The right-angled isosceles triangle prism 23 has two reflective planes 23a and 23b and a non-reflective base plane 23c. The right-angled isosceles triangle prism 24 has two reflective inclined planes 24a and 24b and a non-reflective base plane 24c. The right-angled isosceles triangle prism 23 is fixed to the optical axis, so that the non-reflective base plane 23c is parallel to the optical axis 20. The right-angled isosceles triangle prism 24 is placed so that the non-reflective base plane 24c faces to the right-angle "A" of the right-angled isosceles triangle prism 23 and is also parallel to the non-reflective base plane 23c. The right-angled isosceles triangle prism 24 is movable in a direction marked with an arrow mark "B" which is vertical to the non-reflective base plane 24c or which is perpendicular to the optical axis 20. The optical path 100 is defined by the reflective plane 23a, the reflective inclined plane 24a, the reflective inclined plane 24b, and the reflective plane 23b.

The movement of the right-angled isosceles triangle prism 24 in the direction marked with the arrow mark "B" varies a spatial distance between the paired right-angled isosceles triangle prisms 23 and 24, whereby the optical path length is varied. The adjustment of the distance between the paired right-angled isosceles triangle prisms 23 and 24 adjusts the optical path length. The optical path length varies by the double of a displacement between the paired right-angled isosceles triangle prisms 23 and 24.

The polarization-preserving optical fiber 6 provides an optical waveguide. The polarization-preserving optical fiber 6 has the first terminal 6a coated with a non-reflective coat which may, for example, comprise a dielectric multi-layer structure. The polarization-preserving optical fiber 6 also has the second terminal 6b coated with a high-reflective coat which may, for example, comprise a dielectric multi-layer structure or a metal film. The first terminal 6a is optically coupled to the semiconductor laser device 1 through the optical system. The second terminal 6b coated with the high-reflective coat cooperates with the saturable absorbing region facet 11b of the saturable absorbing region 1b to form the Fabry-Ferot cavity. The cavity length is defined to be the optical path distance between the saturable absorbing region facet 11b and the second terminal 6b of the polarization-preserving optical fiber 6. The optical path distance largely depends on the length of the polarization-preserving optical fiber 6. The cavity length largely depends on the length of the polarization-preserving optical fiber 6. The length of the polarization-preserving optical fiber 6 is so set that the mode-locking oscillation cyclic frequency is not more than 1 GHz. If the cyclic frequency is 1 GHz, then the length of the polarization-preserving optical fiber 6 is set at 5 cm. If the cyclic frequency is 500 MHz, then the length of the polarization-preserving optical fiber 6 is set at 30 cm. If the cyclic frequency is 250 MHz, then the length of the polarization-preserving optical fiber 6 is set at 60 cm. As the cyclic frequency is small, the necessary length of the polarization-preserving optical fiber 6 is long.

Figure 5:
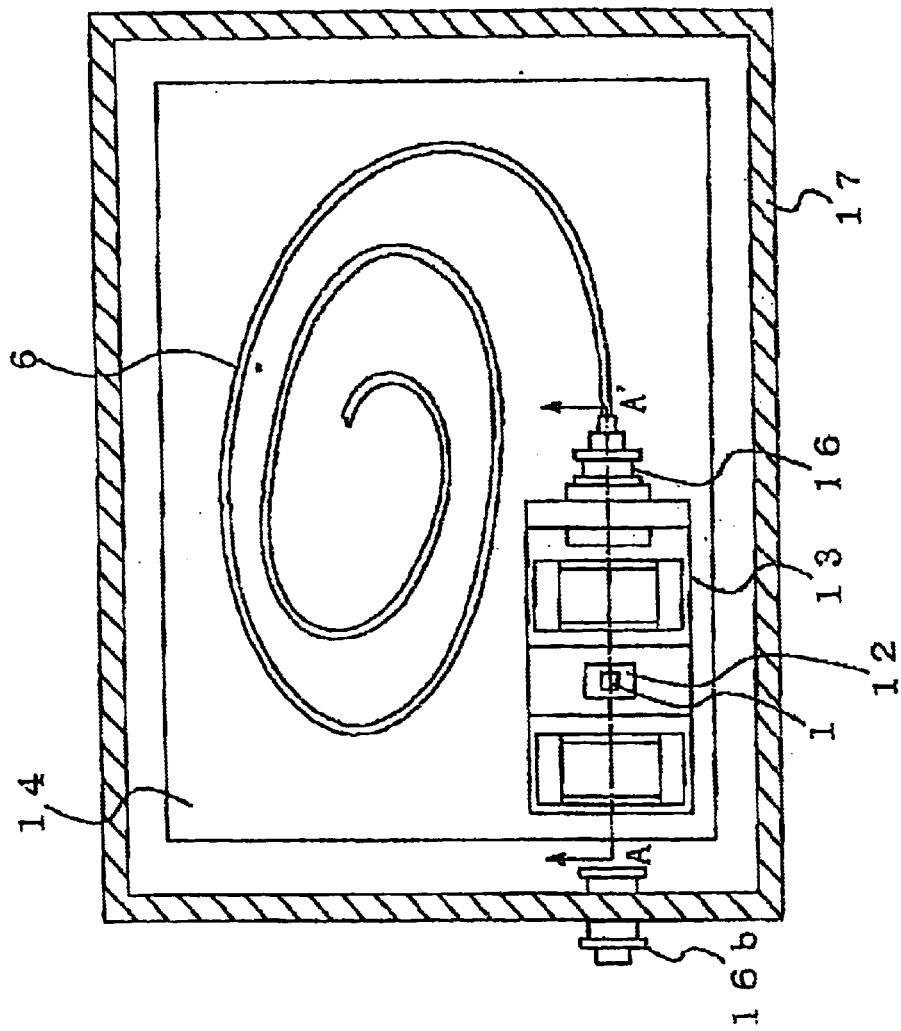
FIG. 5 is a view of an optical system accommodated in a case.
Figure 6:
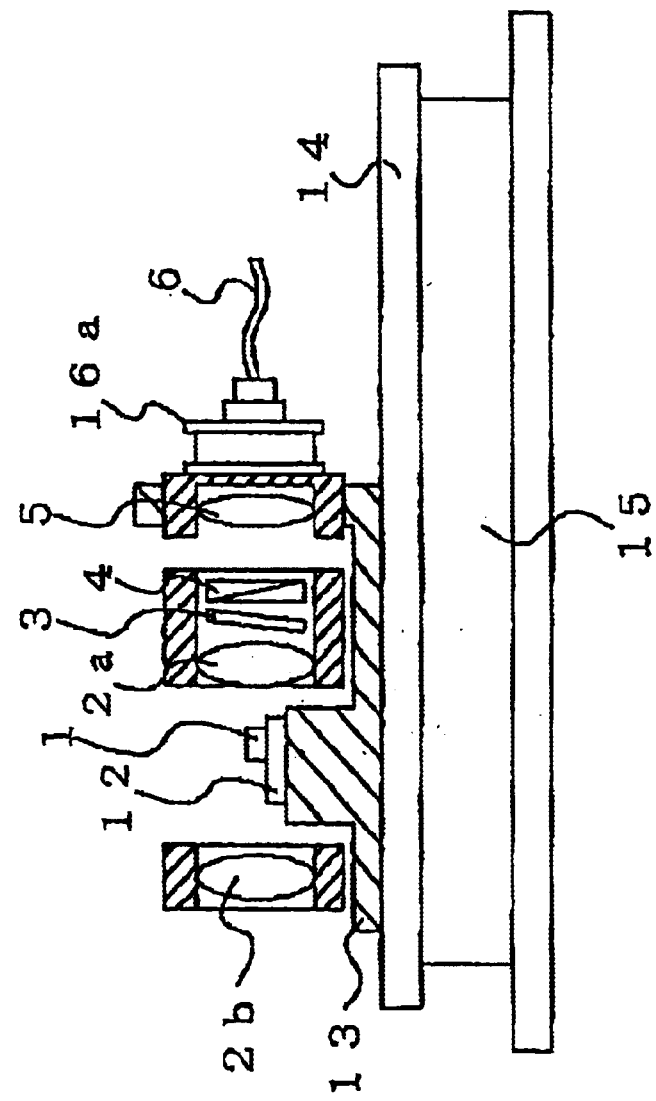
FIG. 6 is a fragmentary cross sectional elevation view of the laser system taken along an A–A' line of FIG. 5.

The above laser system including the polarization-preserving optical fiber 6 may be accommodated in a case 17. FIG. 5 is a view of an optical system accommodated in a case. FIG. 6 is a fragmentary cross sectional elevation view of the laser system taken along an A–A' line of FIG. 5. The use of the polarization-preserving optical fiber 6 allows the use of the compact case 17 accommodating the laser system. The accommodation of the above laser system in the compact case 17 reduces the occupied spatial area, whereby a spatial temperature fluctuation influential to the polarization-preserving optical fiber 6 may be reduced. As a result, stable performances of the laser system may be obtained. It is not necessarily needed to adjust the temperature-depending properties. Notwithstanding, it is preferable to provide a temperature controller in the compact case 17.

A board 14 may be provided in the compact case 17. The board 14 may comprise a ceramic such as aluminum nitride or a metal. A substrate 13 is fixed on the board 14. the substrate 13 may comprise silicon, copper tungsten, or stainless steel. The semiconductor laser device 1, the collimator lenses 2a and 2b, the wavelength splitter 4, the condenser lens 5 fixed over the substrate 13 forms an optical laser module which is fixed over the board 14. The semiconductor substrate 1 is fixed over a heat sink 12 fixed on the substrate 13. The first terminal 6a of the polarization-preserving optical fiber 6 is connected through an optical connector 16 to the optical module, so that the polarization-preserving optical fiber 6 is optically coupled to the laser device 1. The polarization-preserving optical fiber 6 is supported by a supporter over the board 14.

The board 14 is also mounted on a temperature controller 15 such as a Peltier device, so as to maintain a uniform temperature within the compact case 17 for obtaining desired stability in the cavity length, the luminous intensity and oscillation wavelength. The mode-locking laser pulses are emitted from the saturable absorbing region facet 11b of the saturable absorbing region 1b of the semiconductor laser device 1. An optical connector 16b is further provided on a side of the compact case 17 so that the emitted laser pulses may be fetched through the optical connector 16b.

The collimator lens 2b and an optical isolator not illustrated are provided between the semiconductor laser device 1 and the optical connector 16b. In order to obtain the mode-locking oscillation at the cyclic frequency of 250 MHz, the necessary cavity length is 60 cm. The majority of the cavity length is the length of the polarization-preserving optical fiber 6 which is fixed to the board 14 and accommodated in the compact case 17. The sufficient size of the compact case 17 for accommodating the polarization-preserving optical fiber 6 is only about 10 cm. It is also possible that the polarization-preserving optical fiber 6 is replaced by other polarization-preserving optical fiber different in length. The replacement of the polarization-preserving optical fiber different in length can change the cyclic frequency.

It is possible as a modification that in place of the optical connector 16a, a holder is used for holding the first terminal 6a of the polarization-preserving optical fiber 6 to fix the polarization-preserving optical fiber 6 to the substrate 13. In this case, it is preferable to form V-shaped grooves in the substrate 13 and the holder for highly accurate positioning or alignment of the polarization-preserving optical fiber 6. The holder may also be fixed to the substrate 13 or the board 14 by use of screws.

It is also possible as a modification that the laser beam may also be emitted from the second terminal 6b of the polarization-preserving optical fiber 6, provided that an output optical connector is provided with the second terminal 6b of the polarization-preserving optical fiber 6. In this case, the collimator lens 2b is not necessary.

It is also possible as a modification that the semiconductor laser device 1 may comprise the gain region 1a only without the saturable absorption region 1b, provided that an alternating current of a mode-locking frequency is superimposed with the injection current into the gain region 1a.

It is also possible as a modification that in place of the semiconductor laser device 1, a distributed feed-back semiconductor laser device, a distributed Bragg reflector semiconductor laser device, and a modulator-integrated semiconductor laser. device may be available. The modulator-integrated semiconductor laser device have modulators which are applied with a high frequency voltage at the mode-locking frequency. The use of either the distributed feed-back semiconductor laser device or the distributed Bragg reflector semiconductor laser device makes it unnecessary to use the wavelength splitter.

In accordance with the present invention, a majority part of the cavity comprises the optical fiber 6 which has a mechanical flexibility and a deformability, which provides the following advantages. The polarization-preserving optical fiber 6 preserves the polarization. The polarization-preserving optical fiber 6 is accommodated in compact together with the other parts in the compact case 17. The sufficient size of the compact case 17 is only about 20 cm even the length of the polarization-preserving optical fiber 6 is much longer than the size of the compact case 17. Further, the polarization-preserving optical fiber 6 is subjected to the temperate control together with the other parts in the compact case 17. All of the parts are accommodated within the small space defined by the compact case 17, whereby the spatial temperature distribution has a reduced fluctuation and a highly accurate temperature control is possible. The laser oscillation wavelength, the cyclic frequency, the polarization state and the luminance intensity are stable over the undesirable mechanical vibration, ambient temperature variation, substrate strain due to placement of the parts, whereby the laser system has an improved reliability.

In place of using the long free space for the optical waveguide of the external cavity, in accordance with the present invention, the majority part of the optical waveguide comprises the optical fiber, so that no displacement of the optical axis appears even by displacement of the second terminal of the optical fiber due to the mechanical vibration sand the strain.

The wavelength splitter and the optical path length adjuster are provided and further the optical fiber is exchangeable for allowing adjustments Lo the oscillation wavelength and the cyclic frequency. Various combinations of the desirable length of the optical fiber with the desirable oscillation frequency of the semiconductor laser device are optional. Changes to the cyclic frequency and the oscillation wavelength are easy.

It is also possible that the semiconductor laser device and the optical fiber are accommodated in separate compact cases respectively, so that the separate temperature controls to the separate compact cases are allowable. Further higher accurate temperature controls can he realized, and the further highly stable performances of the laser device can be obtained. The separate compact cases are used as units for modules, for allowing exchanges in module unit with a great convenience.

Second Embodiment

Figure 7:
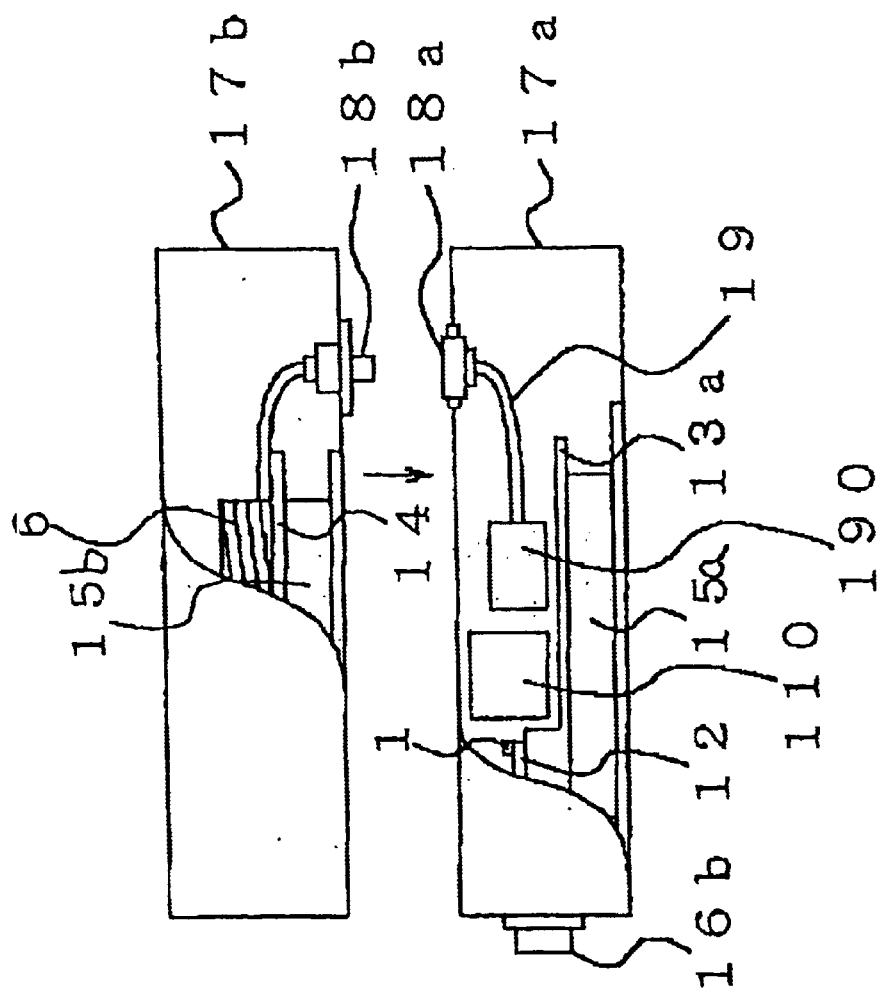
FIG. 7 is a schematic view of a second novel mode locking, semiconductor laser system including a mode locking semiconductor laser and an external cavity in a second embodiment in accordance with the present invention.

A second embodiment according to the present invention will be described in detail with reference to the drawings. FIG. 7 is a schematic view of a second novel mode locking semiconductor laser system including a mode locking semiconductor laser and an external cavity in a second embodiment in accordance with the present invention.

A main difference of this embodiment from the above-described first embodiment is that the semiconductor laser device 1 and the polarization-preserving optical fiber 6 are accommodated in separate compact cases 17a and 17b. The semiconductor laser device 1 and the other optical system 110 including the collimator lens 2a, the wavelength splitter 3, the optical path length adjuster 4, and the condenser lens 5 are mounted on the substrate 13a which is fixed over the temperature controller 15a such as the Peltier device. The semiconductor laser device 1 and the other optical system 110 as well as a holder 190 and a connector optical fiber 19 are thus accommodated in the first compact case 17a.

The polarization-preserving optical fiber 6 is placed over the board 14 fixed over the temperature controller 15b such as the Peltier the second compact case 11b. The second compact case 17b is mounted over the first compact case 17a. The first compact case 17a has a first optical connector 18a on the top wall, whilst the second compact case 17b has a second optical connector 18b on the bottom wall. The first optimal connector 18a and the second optical connector 18b are connected with each other so that the polarization-preserving optical fiber 6 is optically coupled through the connector optical fiber 19 and the optical system 110 to the semiconductor laser device 1.

Figure 8:
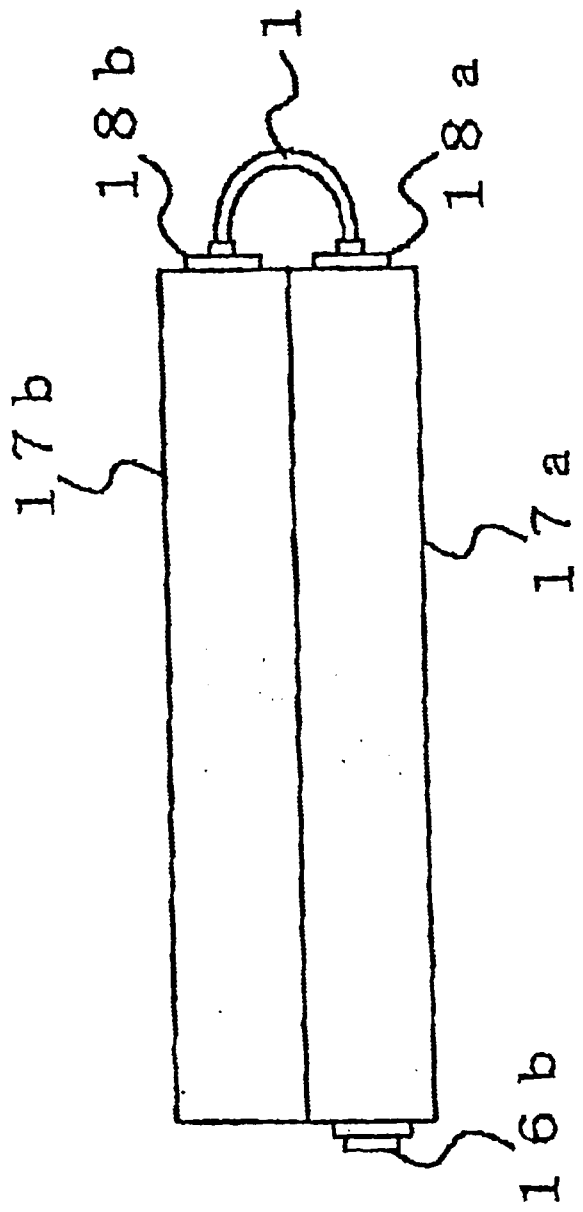
FIG. 8 is a schematic view of a modified second novel mode locking semiconductor laser system including a mode locking semiconductor laser and an external cavity in a modified second embodiment in accordance with the present invention.

FIG. 8 is a schematic view of a modified second novel mode locking semiconductor laser system including a mode locking semiconductor laser and an external cavity in a modified second embodiment in accordance with the present invention. The second compact case 17b is mounted over the first compact case 17a. The first compact case 17a has a first optical connector 18a on the side wall, whilst the second compact case 17b has a second optical connector 18b are connected to each other through an additional connector optical fiber 19a, so that the polarization-preserving optical fiber 19a and the optical system 110 to the semiconductor laser device 1.

Figure 9:
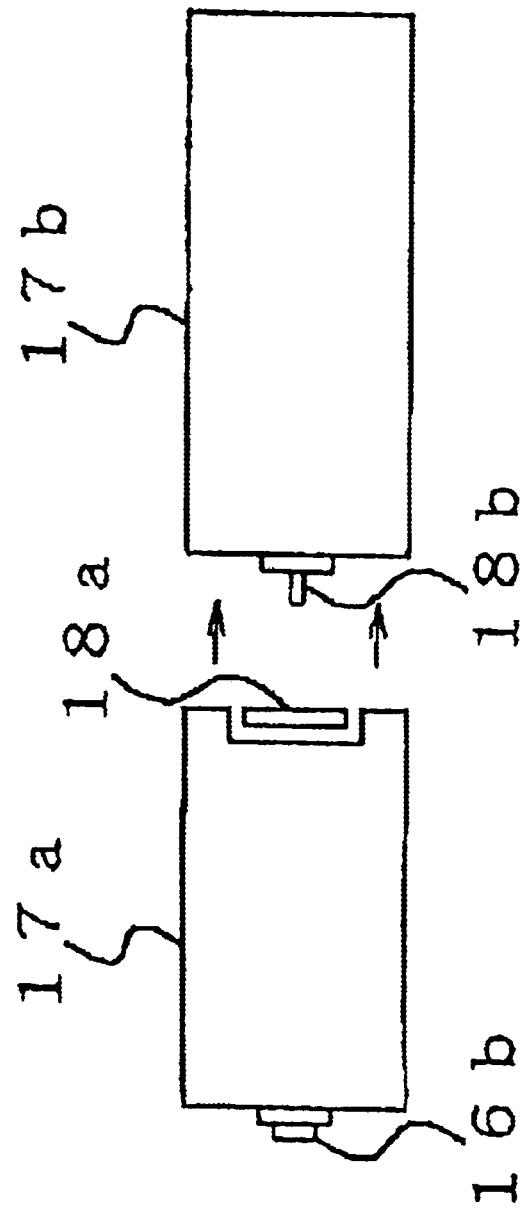
FIG. 9 is a schematic view of a further modified second novel mode locking semiconductor laser system including a mode locking semiconductor laser and an external cavity in a further modified second embodiment in accordance with the present invention.

FIG. 9 is a schematic view of a further modified second novel mode locking semiconductor laser system including a mode locking semiconductor laser and an external cavity in a further modified second embodiment in accordance with the present invention. The second compact case 17b is connected through one side to one side of the first compact case 17a. The first compact case 17a has a first optical connector 18a on the side wall, whilst the second compact case 17b has a second optical connector 18b on the conforming side wall. The first optical connector 18a and the second optical connector 18b arc connected with each other, so that the polarization-preserving optical fiber 6 is optically coupled through the optical system 110 to the semiconductor laser device 1.

The polarization-preserving optical fiber 6 is accommodated within the second compact case 17b without considering the layout in relation to the semiconductor laser device 1. The separate module structure of this embodiment is suitable for obtaining the longer cavity length for the low cyclic frequency.

The above separate module structure is also convenient for exchanging the optical fiber with different length for changing the cyclic frequency and the oscillation frequency.

It is possible as a modification that in place of the optical connector 16a, a holder is used for holding the first terminal 6a of the polarization-preserving optical fiber 6 to fix the polarization-preserving optical fiber 6 to the substrate 13. In this case, it is preferable to form V-shaped grooves in the substrate 13 and the holder for highly accurate positioning or alignment of the polarization-preserving optical fiber 6. The holder may also be fixed to the substrate 13 or the board 14 by use of screws.

It is also possible as a modification that the laser beam may also be emitted from the second terminal 6b of the polarization-preserving optical fiber 6, provided that an output optical connector is provided with the second terminal 6b of the polarization-preserving optical fiber 6. In this case, the collimator lens 2b is not necessary.

It is also possible as a modification that the semiconductor laser device 1 may comprise the gain region 1a only without the saturable absorption region 1b, provided that an alternating current of a mode-locking frequency is superimposed with the injection current into the gain region 1a.

It is also possible as a modification that in place of the semiconductor laser device 1, a distributed feed-back semiconductor laser device, a distributed Bragg reflector semiconductor laser device, and a modulator-integrated semiconductor laser device may be available. The modulator-integrated semiconductor laser device have modulators which are applied with a high frequency voltage at the mode-locking frequency. the use of either the distributed feed-back semiconductor laser device or the distributed Bragg reflector semiconductor laser device makes it unnecessary to use the wavelength splitter.

In accordance with the present invention, a majority part of the cavity comprises the optical fiber 6 which has a mechanical flexibility and a deformability, which provides the following advantages. The polarization-preserving optical fiber 6 preserves the polarization. The polarization-preserving optical fiber 6 is accommodated in compact together with the other parts in the compact case 17. The sufficient size of the compact case 17 is only about 20 cm even the length of the polarization-preserving optical fiber 6 is much longer than the size of the compact case 17. Further, the polarization-preserving optical fiber 6 is subjected to the temperate control together with the other parts in the compact case 17. All of the parts are accommodated within the small space defined by the compact case 17, whereby the spatial temperature distribution has a reduced fluctuation and a highly accurate temperature control is possible. The laser oscillation wavelength, the cyclic frequency, the polarization state and the luminance intensity are stable over the undesirable mechanical vibration, ambient temperature variation, substrate strain due to placement of the parts, whereby the laser system has an improved reliability.

In place of using the long free space for the optical waveguide of the external cavity, in accordance with the present invention, the majority part of the optical waveguide comprises the optical fiber, so that no displacement of the optical axis appears even by displacement of the second terminal of the optical fiber due to the mechanical vibration and the strain.

The wavelength splitter and the optical path length adjuster are provided and further the optical fiber is exchangeable for allowing adjustments to the oscillation wavelength and the cyclic frequency. Various combinations of the desirable length of the optical fiber with the desirable oscillation frequency of the semiconductor laser device are optional. Changes to the cyclic frequency and the oscillation wavelength are easy.

It is also possible that the semiconductor laser device and the optical fiber are accommodated in separate compact cases respectively, so that the separate temperature controls to the separate compact cases are allowable. Further higher accurate temperature controls can be realized, and the further highly stable performances of the laser device can be obtained. The separate compact cases are used as units for modules for allowing exchanges in module unit with a great convenience.

Third Embodiment

Figure 10:
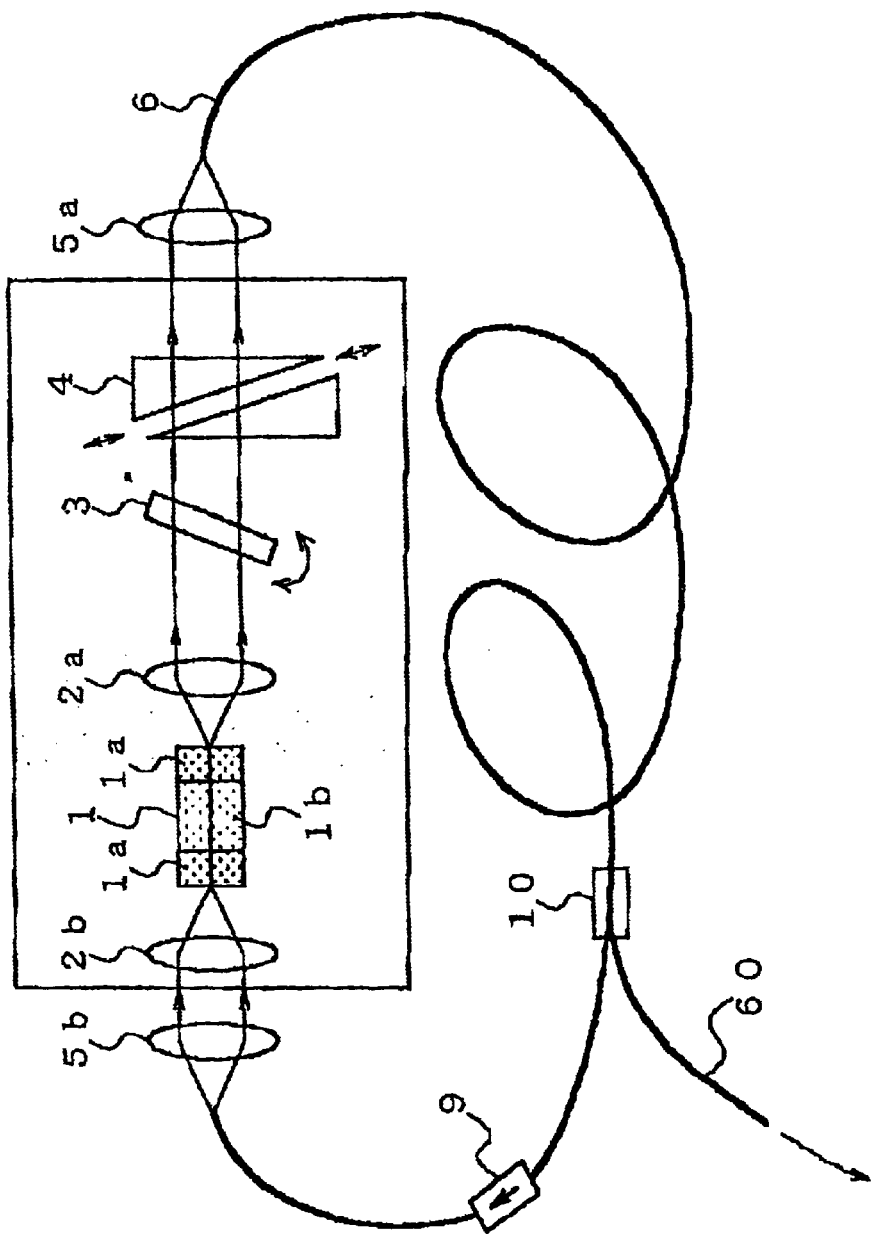
FIG. 10 is a schematic view of a third novel mode locking semiconductor laser system including a mode locking semiconductor laser and an external cavity in a third embodiment in accordance with the present invention.

A third embodiment according to the present invention will be described in detail with reference to the drawings. FIG. 10 is a schematic view of a third novel mode locking semiconductor laser system including a mode locking semiconductor laser and an external cavity in a third embodiment in accordance with the present invention.

A main difference of this embodiment from the above-described first embodiment is to form a ring-cavity, wherein an optical isolator 9 is provided on a point of the polarization-preserving optical fiber 6 and a directional coupler 10 on another point of the polarization-preserving optical fiber 6. The polarization-preserving optical fiber 6 forms a loop to the optical module. A non-looped optical fiber 60 is further connected to the directional coupler 10 for fetching the emitted laser beam.

The optical isolator 9 allows oscillation in a clockwise-directional traveling wave locking mode. It is, of course, possible that the optical isolator 9 allows oscillation in a counter-clockwise-directional traveling wave locking mode. It is also possible that in place of the directional coupler 10, an optical branching filter may also be available for fetching the laser pulses. It is also possible that in place of the directional coupler 10, a translucent mirror is provided on any point on the polarization-preserving optical fiber 6. It is also possible that the isolator 9 is not provided.

Figure 11:
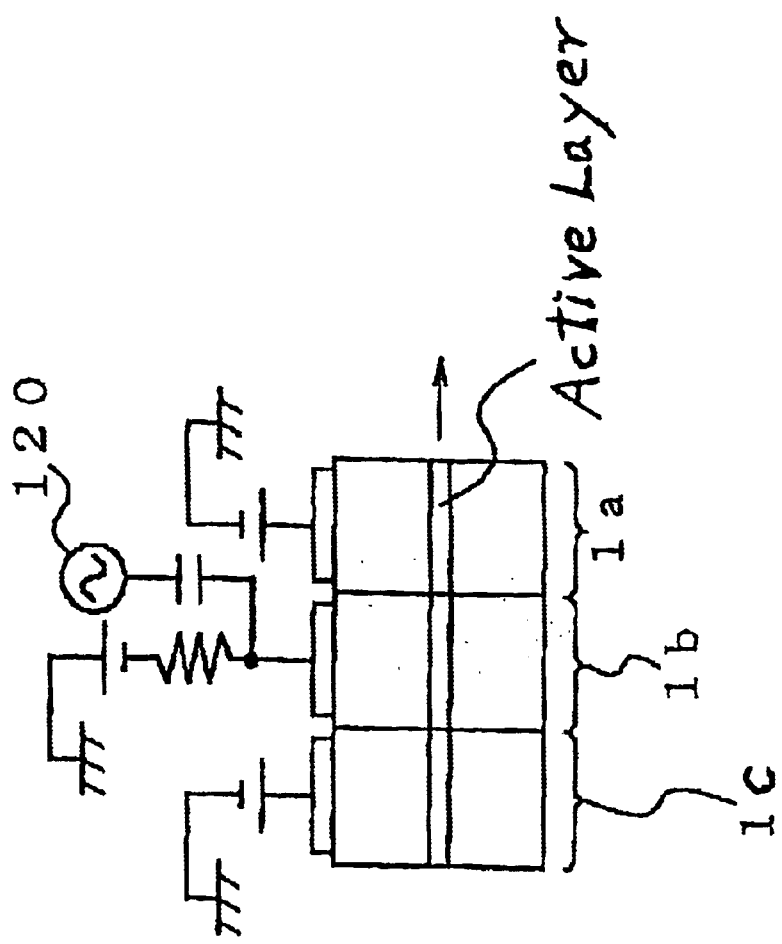
FIG. 11 is a schematic view of a structure of the semiconductor laser device used in the optical system.

The used semiconductor laser device 1 may have the gain region 1a and the saturable absorption region 1b as in the foregoing embodiments. It is, however, possible that the used semiconductor laser device 1 may have a different structure as follows. FIG. 11 is a schematic view of a structure of the semiconductor laser device used in the optical system. The semiconductor laser device 1 comprises a first gain region 1a, a saturable absorption region 1b and a second gain region 1c, wherein the saturable absorption region 1b is positioned between the first and second gain regions 1a and 1c. The first and second gain regions 1a and 1c are applied with dc injection currents. The back-base and the high frequency voltage signal as modulated are applied to the saturable absorption region 1b.

The current injection to the gain regions 1a and 1c generate laser beams which are then modulated by the saturable absorption region 1b. The laser beam travels the ring-cavity formed by the polarization-preserving optical fiber 6. The laser beam as traveled through the ring-cavity is then incident into the semiconductor laser device 1, and the laser beam is modulated by the saturable absorption region 1b at a cycle time of the traveling of the laser beam through the ring-cavity or at a remainder of diving the cycle time with an integer number, so that the laser beams are grown up to short pulses of a cyclic frequency synchronized with the cycle time. The short pulses are then fetched from the non-looped optical fiber 60.

Figure 12:
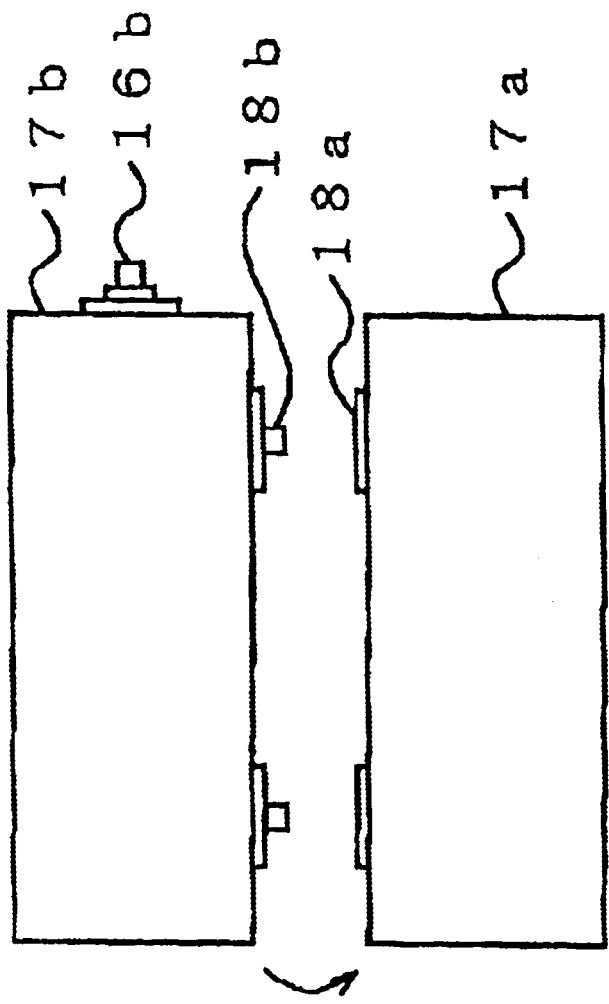
FIG. 12 is a view of the modules of the laser system.

It is also possible as a modification that the above laser system is formed in two separate modules as described in the second embodiment. FIG. 12 is a view of the modules of the laser system. The semiconductor laser device 1 and the optical system 110 are accommodated in the first compact case 17a The optical fiber is accommodated in the second compact case 17b. The first and second compact cases 17a and 17b are connected through the connectors 18a and 18b. In FIG. 12, the second compact case 17b accommodating the optical fiber is mounted over the first compact case 17a accommodating the semiconductor laser device 1 and the optical system 110. It is further possible to modify the above module structure to other module structures as shown in FIGS. 8 and 9 as described in the second embodiment.

It is possible as a modification that in place of the optical connector 16a, a holder is used for holding the first terminal 6a of the polarization-preserving optical fiber 6 to fix the polarization-preserving optical fiber 6 to the substrate 13. In this case, it is preferable to form V-shaped grooves in the substrate 13 and the holder for highly accurate positioning or alignment of the polarization-pre-serving optical fiber 6. The holder may also be fixed to the substrate 13 or the board 14 by use of screws.

It is also possible as a modification that the laser beams may also be emitted from the second terminal 6b of the polarization-preserving optical fiber 6, provided that an output optical connector is provided with the second terminal 6b of the polarization-preserving optical fiber 6. In this case, the collimator lens 2b is not necessary.

It is also possible as a modification that the semiconductor laser device 1 may comprise the gain region 1a only without the saturable absorption region 1b, provided that an alternating current of a mode-locking frequency is superimposed with the injection current into the gain region 1a.

It is also possible as a modification that in place of the semiconductor laser device 1, a distributed feed-back semiconductor laser device, a distributed Bragg reflector semiconductor laser device, and a modulator-integrated semiconductor laser device may be available. The modulator-integrated semiconductor laser device have modulators which are applied with a high frequency voltage at the mode-locking frequency. The use of either the distributed feed-back semiconductor laser device or the distributed Bragg reflector semiconductor laser device makes it unnecessary to use the wavelength splitter.

In accordance with the present invention, a majority part of the cavity comprises the optical fiber 6 which has a mechanical flexibility and a deformability, which provides the following advantages. The polarization-preserving optical fiber 6 preserves the polarization. The polarization-preserving optical fiber 6 is accommodated in compact together with the other parts in the compact case 17. The sufficient size of the compact case 17 is only about 20 cm even the length of the polarization-preserving optical fiber 6 is much longer than the size of the compact case 17. Further; the polarization-preserving optical fiber 6 is subjected to the temperate control together with the other parts in the compact case 17. All of the parts are accommodated within the small space defined by the compact case 17, whereby the spatial temperature distribution has a reduced fluctuation and a highly accurate temperature control is possible. The laser oscillation wavelength, the cyclic frequency, the polarization state and the luminance intensity are stable over the undesirable mechanical vibration, ambient temperature variation, substrate strain due to placement of the parts, whereby the laser system has an improved reliability.

In place of using the long free space for the optical waveguide of the external cavity, in accordance with the present invention, the majority part of the optical waveguide comprises the optical fiber, so that no displacement of the optical axis appears even by displacement of the second terminal of the optical fiber due to the mechanical vibration and the strain.

The wavelength splitter and the optical path length adjuster are provided and further the optical fiber is exchangeable for allowing adjustments to the oscillation wavelength and the cyclic frequency. Various combinations of the desirable length of the optical. fiber with the desirable oscillation frequency of the semiconductor laser device are optional. Changes to the cyclic frequency and the oscillation wavelength arc easy.

It is also possible that the semiconductor laser device and the optical fiber are accommodated in separate compact cases respectively, so that the separate temperature controls to the separate compact cases arc allowable. Further higher accurate temperature controls can be realized, and the further highly stable performances of the laser device can be obtained. The separate compact cases are used as units for modules for allowing exchanges in module unit with a great convenience.

Although the invention has been described above in connection with several preferred embodiments therefor, it will be appreciated that those embodiments have been provided solely for illustrating the invention, and not in a limiting sense. Numerous modifications and substitutions of equivalent materials and techniques will be readily apparent to those skilled in the art after reading the present application, and all such modifications and substitutions are expressly understood to fall within the true scope and spirit of the appended claims.

What is claimed is:

1. An optical system including a cavity which comprises a semiconductor light-emitting device, and an optical fiber having a first terminal optically coupled to said semiconductor light-emitting device, said cavity having a cavity length defined between a first facet of said semiconductor light-emitting device and a second terminal of said optical fiber, wherein,
   a length of said optical fiber is such that a mode-locking oscillation frequency is not more than 1 GHz,
   wherein said optical system comprises a single module, provided that said semiconductor light-emitting device and said optical fiber are accommodated in a single case having a size smaller than said length of said optical fiber, and
   said single case further accommodates a temperature controller for controlling a temperature in said single case.

2. The optical system of claim 1, wherein the said cavity length is adjustable by an optical path length adjuster.

3. The optical system of claim 2, wherein the optical path length adjuster is a set of paired wedge prisms.

4. The optical system of claim 2, wherein the optical path length adjuster is a set of right-angled isosceles triangle prisms.

5. An optical system including a cavity which comprises a semiconductor light-emitting device, and an optical fiber having a first terminal optically coupled to said semiconductor light-emitting device, said cavity having a cavity length defined between a first facet of said semiconductor light-emitting device and a second terminal of said optical fiber, wherein,
   a length of said optical fiber is such that a mode-locking oscillation frequency is not more than 1 GHz,
   said optical system comprises separate first and second modules which are connectable to each other through at least one connector, provided that said semiconductor light-emitting device is accommodated in said first case and said optical fiber is accommodated in said second case having a size smaller than said length of said optical fiber, and
   wherein each of said first and second cases further accommodates a temperature controller for controlling a temperature in each of said first and second cases.

6. An optical system including a ring-cavity which comprises a semiconductor light-emitting device, and a looped optical fiber having first and second terminals optically coupled to said semiconductor light-emitting device, said ring-cavity having a cavity length defined by a length of said looped optical fiber and an optical path length between said first and second terminals, wherein,
   a length of said looped optical fiber is such that a mode-locking oscillation frequency is not more than 1 GHz,
   said optical system comprises a single module, provided that said semiconductor light-emitting device and said optical fiber are accommodated in a single case having a size smaller than said length of said looped optical fiber,
   said single case further accommodates a temperature controller for controlling a temperature in said single case.

7. An optical system including a ring-cavity which comprises a semiconductor light-emitting device, and a looped optical fiber having first and second terminals optically coupled to said semiconductor light-emitting device, said ring-cavity having a cavity length defined by a length of said looped optical fiber and an optical path length between said first and second terminals, wherein,
   a length of said looped optical fiber is such that a mode-locking oscillation frequency is not more than 1 GHz,
   said optical system comprises separate first and second modules which are connectable to each other through at least one connector, provided that said semiconductor light-emitting device is accommodated in said first case and said looped optical fiber is accommodated in said second case having a size smaller than said length of said looped optical fiber, and
   each of said first and second cases further accommodates a temperature controller for controlling a temperature in each of said first and second cases.

8. A mode locking semiconductor laser system, comprising:
   a semiconductor laser device with a reflective facet; and
   a polarization-preserving optical fiber with a non-reflective terminal at a fixed end and a reflective terminal at a free end,
   the polarization-preserving optical fiber optically coupled to the semiconductor laser device,
   a cavity length is defined between the reflective facet of the semiconductor laser device and the reflective terminal of the polarization-preserving optical fiber,
   the free end of the optical fiber is free of connection to any element;
   a first collimator lens;
   a wavelength splitter;
   an optical path length adjuster; and
   a condenser lens
   the semiconductor laser device with a reflective facet, the first collimator lens, the wavelength splitter, the optical path length adjuster, and the condenser lens aligned on an optical axis,
   the first collimator lens disposed between the semiconductor laser device and the wavelength splitter,
   the wavelength splitter disposed between the first collimator lens and the optical path length adjuster,
   the condenser lens disposed between the optical path length adjuster and the non-reflective terminal of the polarization-preserving optical fiber, and
   the polarization-preserving optical fiber optically coupled to the semiconductor laser device through the first collimator lens, the wavelength splitter, the optical path length adjuster and the condenser lens.

9. The system of claim 8, wherein the optical path length adjuster is a set of paired wedge prisms.

10. The system of claim 8, wherein the optical path length adjuster is a set of right-angled isosceles triangle prisms.

11. The system of claim 8, further comprising a second collimator lens arranged to allow an optical output emitted from the reflective facet to be transmitted through the second collimator lens.

12. The system of claim 8, wherein a length of the optical fiber is such that a mode-locking oscillation frequency is not more than 1 GHz.

* * * * *